(12) United States Patent
Ramian

(10) Patent No.: US 12,345,742 B2
(45) Date of Patent: Jul. 1, 2025

(54) SIGNAL PROCESSING METHOD AND SIGNAL PROCESSING SYSTEM

(71) Applicant: Rohde & Schwarz GmbH & Co. KG, Munich (DE)

(72) Inventor: Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 130 days.

(21) Appl. No.: 18/177,280

(22) Filed: Mar. 2, 2023

(65) Prior Publication Data

US 2023/0280373 A1 Sep. 7, 2023

(30) Foreign Application Priority Data

Mar. 2, 2022 (CN) .......................... 202210199114.8

(51) Int. Cl.
*G01R 13/02* (2006.01)

(52) U.S. Cl.
CPC .................. *G01R 13/0218* (2013.01)

(58) Field of Classification Search
CPC ................................................ G01R 13/0218
See application file for complete search history.

(56) References Cited

U.S. PATENT DOCUMENTS

| 10,761,134 | B2 | 9/2020 | Lagler et al. | |
| 11,112,447 | B1 * | 9/2021 | Martens | ................ G06F 17/13 |
| 11,874,312 | B1 * | 1/2024 | Lagler | ............. G01R 31/31709 |
| 2019/0064236 | A1 | 2/2019 | Verspecht et al. | |
| 2021/0018561 | A1 | 1/2021 | Ruengeler et al. | |

* cited by examiner

*Primary Examiner* — Reena Aurora
(74) *Attorney, Agent, or Firm* — CHRISTENSEN O'CONNOR JOHNSON KINDNESS PLLC

(57) ABSTRACT

A signal processing method for selectively removing noise from a digital input signal is provided. The method includes the steps of, for example, receiving, by a signal input, a digital input signal of a device under test, determining, by an analysis circuit, a DUT noise contribution to noise of the digital input signal, wherein the DUT noise contribution is associated with noise originating from the device under test, reducing, by the analysis circuit, a noise level of the digital input signal to a noise level of the DUT noise contribution determined, thereby obtaining a noise-reduced output signal, and providing the noise-reduced output signal to a measurement application for further processing. A signal processing system for carrying out the method or others is also provided.

10 Claims, 2 Drawing Sheets

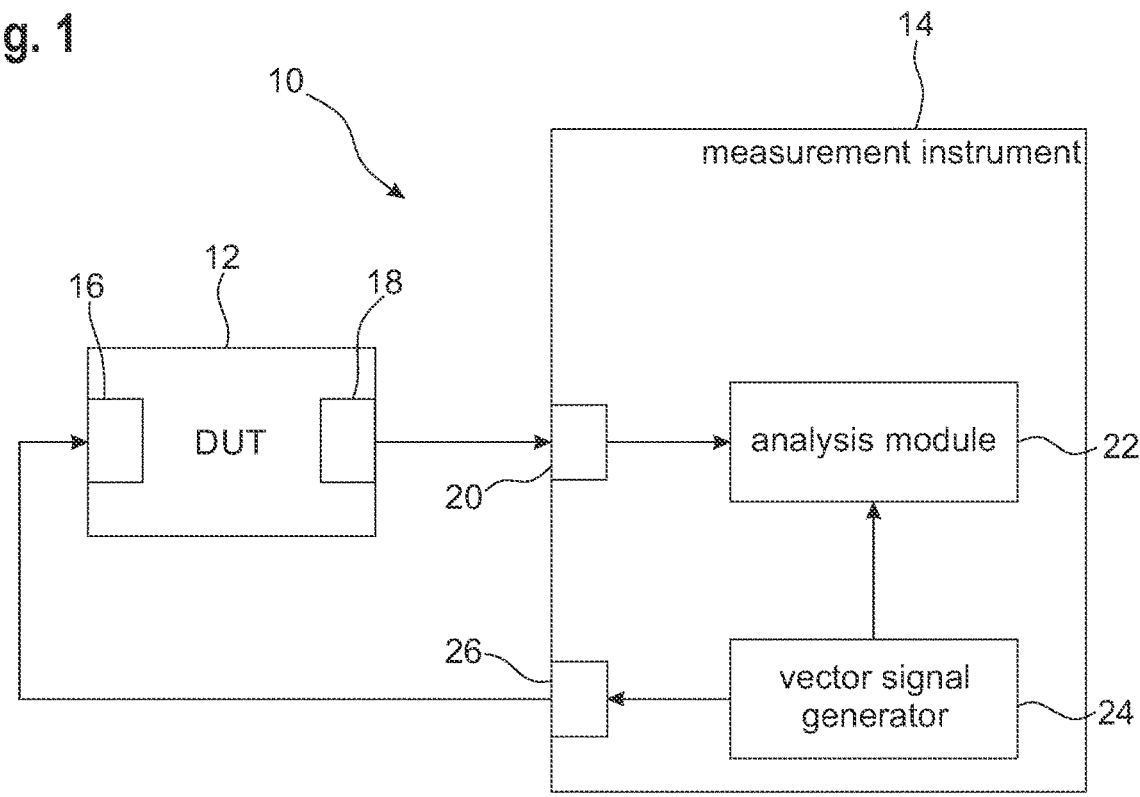
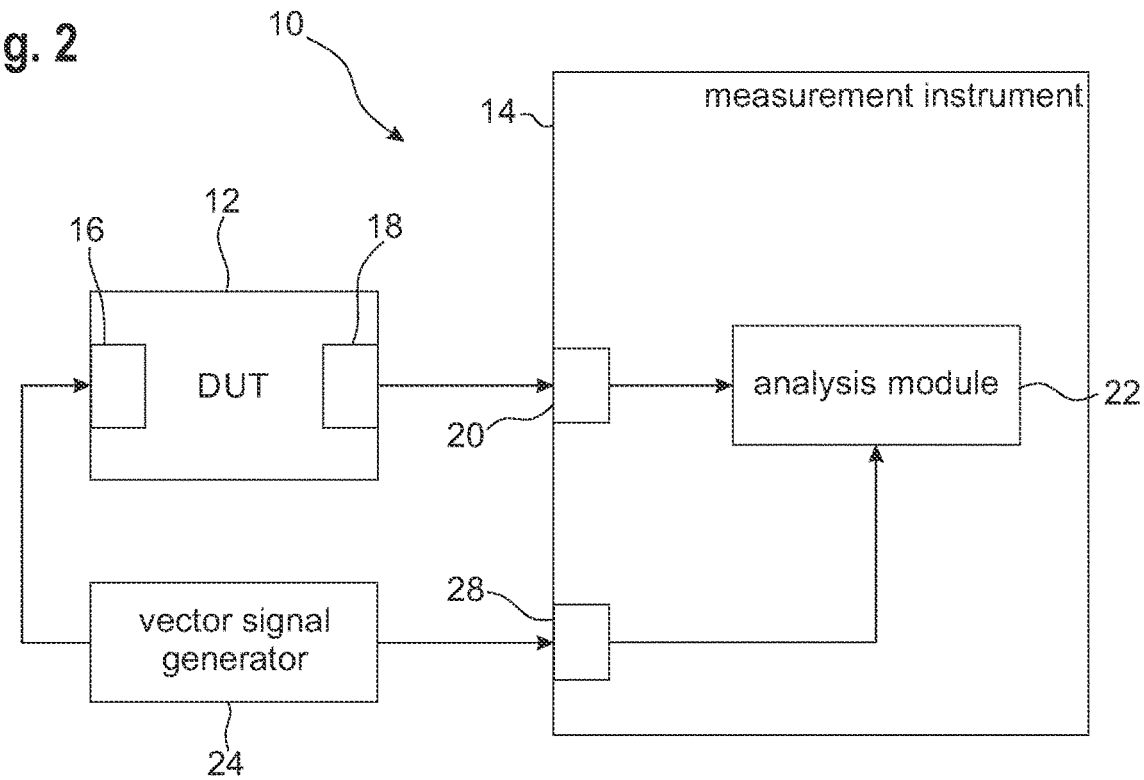

SIGNAL PROCESSING METHOD AND SIGNAL PROCESSING SYSTEM

FIELD OF THE DISCLOSURE

Embodiments of the present disclosure generally relate to a signal processing method for selectively removing noise from a digital input signal. Embodiments of the present disclosure further relate to a signal processing system.

BACKGROUND

The noise figure is a measure that is of interest for characterizing the behavior of a device under test under operation, for instance a communication device such as a user end device or any other signal processing device.

If noise requirements on a particular device under test are strict, i.e., the device under test may only generate small amounts of noise in order to pass a certain test, additional noise generated by the measurement equipment itself may become highly relevant.

Noise-reduction techniques are known that reduce the overall noise level of a signal chain. However, these techniques do not distinguish between different sources of the noise such that the noise generated by the device under test may inadvertently be reduced as well. Thus, the noise figure of the device under test cannot be measured precisely with these techniques.

A way to circumvent this problem is using high-quality measurement instruments having a particularly low inherent noise level. However, such measurement instruments are rather expensive.

Thus, there is a need for a signal processing method as well as a signal processing system that allow for a cost-efficient assessment of a noise contribution of a device under test.

SUMMARY

Embodiments of the present disclosure provide a signal processing method for selectively removing noise from a digital input signal. In an embodiment, the method comprises the steps of receiving, by a signal input, a digital input signal of a device under test, determining, by an analysis circuit, a DUT noise contribution to noise of the digital input signal, wherein the DUT noise contribution is associated with noise originating from the device under test, deducing, by the analysis circuit, a noise level of the digital input signal to a noise level of the DUT noise contribution determined, thereby obtaining a noise-reduced output signal, and providing the noise-reduced output signal to a measurement application for further processing.

Embodiments of the signal processing method disclosed herein are based on the idea to selectively remove noise from the digital input signal, wherein the removed noise originates from sources other than the device under test. In other words, noise contributions from components different to the DUT itself are removed from the digital input signal. However, this is not achieved by noise cancelling techniques known in the state of the art, but by reducing the noise level of the digital input signal to a level that corresponds to the noise level of the DUT noise contribution determined previously and, then, further processing the noise-reduced output signal to the measurement application.

For example, the removed noise may originate from a measurement instrument conducting the measurements, or from other electronic components in the signal chain.

Accordingly, the noise level of the digital input signal is reduced significantly, while the noise generated by the device under test, i.e., the noise contribution of the device under test, remains in the noise-reduced output signal. In other words, the noise-reduced output signal corresponds to the digital input signal, but with all noise except for the noise contribution of the device under test removed. Thus, the noise contribution of the device under test is still present in the noise-reduced output signal.

In some embodiments, the measurement application may be configured to determine a noise level of the device under test based on the noise-reduced output signal. The noise level of the device under test can be determined with high precision, as all other noise sources have been removed from the digital input signal.

Thus, using expensive measurement hardware having low inherent noise is not necessary with the signal processing methods of the present disclosure. Instead, more cost-efficient measurement hardware can be used, as the additional noise that may be generated by the measurement hardware and other electronic components in the signal chain is selectively removed.

In some embodiments, the term "measurement application" includes suitable hardware, suitable software, or a combination of hardware and software that is configured to have a certain described functionality. The hardware may, inter alia, comprise a CPU, a GPU, an FPGA, an ASIC, or other types of electronic circuitry.

The DUT noise contribution may be determined by any suitable technique, for example by any suitable technique known from the state of the art. For example, the techniques described in U.S. Pat. No. 10,761,134 B2 may be used in order to determine the DUT noise contribution. U.S. Pat. No. 10,761,134 B2 is incorporated herein by reference its entirety The DUT noise contribution may be determined only once in a first set of measurements before the further steps of the signal processing method are performed. The results of this first set of measurements, i.e., the DUT noise contribution, can then be used for any other measurement conducted by the signal processing method.

According to an aspect of the present disclosure, the digital input signal comprises, for example, IQ data. Thus, the digital input signal comprises in-phase data (I data) and quadrature data (Q data), such that the digital input signal comprises amplitude information and phase information.

Accordingly, the noise-reduced output signal may comprise IQ data having a reduced noise level compared to the noise level of the digital input signal. More precisely, the noise level of the IQ data is reduced to the noise level of the DUT noise contribution determined.

According to another aspect of the present disclosure, an averaging technique is applied, for example, to the received digital input signal in order to reduce the noise level, thereby obtaining a preliminary noise-reduced signal. Usually, noise contributions to the digital input signal are normally distributed, i.e., the noise contributions have the shape of a Gauss function, for example of a Gauss function with expectation value zero. By appropriately averaging the digital input signal, the noise contributions cancel at least partially, such that the overall noise level is reduced.

In an embodiment of the present disclosure, the determined DUT noise contribution is added to the preliminary noise-reduced signal in order to obtain the noise-reduced output signal. In the preliminary noise-reduced signal, all noise contributions have been removed at least partially, irrespective of the origin of the respective noise contribution. As the determined DUT noise contribution is re-added to the preliminary noise-reduced signal, the noise level of the noise-reduced output signal corresponds to the noise level of the DUT noise contribution.

In a further embodiment of the present disclosure, the averaging technique is an IQ averaging technique. Thus, the digital input signal comprises in-phase data (I data) and quadrature data (Q data), such that the digital input signal comprises amplitude information and phase information. Due to the IQ averaging technique applied to the digital input signal, the preliminary noise-reduced signal comprises IQ data having a reduced noise level compared to the noise level of the digital input signal.

Analogously to the embodiment described above, the determined DUT noise contribution may be added to the preliminary noise-reduced signal in order to obtain the noise-reduced output signal, such that the noise-reduced output signal comprises IQ data with a noise level corresponding to the noise level of the DUT noise contribution.

It is noted that the averaging techniques mentioned above, for example the IQ averaging techniques mentioned above, are per se well known in the prior art. Thus, these techniques are not described in more detail in the present disclosure.

In general, I/Q averaging is a method to compensate and exclude noise contributions from all members of the signal path, namely source, DUT, and sink. Accordingly, it cannot be differentiated from where the noise originated from. Therefore, this technique is usually not utilized for error vector magnitude (EVM) measurements, as the noise contribution from the DUT shall be included in the EVM measurement.

However, as discussed above, with embodiments of the signal processing method of the present disclosure, the noise contribution of the DUT is known at the current operating point. As mentioned above, the digital input signal has been processed by an I/Q averaging technique, thereby obtaining the preliminary noise-reduced signal. Afterwards, the previously determined DUT noise contribution is added to the preliminary noise-reduced signal in order to obtain the noise-reduced output signal. Re-adding of the noise contribution of the DUT allows for EVM measurements.

In some embodiments, the previously determined noise contribution of the DUT may be added to the I/Q averaged EVM measurement, or even to the I/Q data before the I/Q data is fed to other, e.g., standard specific, I/Q based applications.

Another aspect of the present disclosure provides that the averaging technique is applied, for example, to the digital input signal until the noise level of the digital input signal matches the noise level of the DUT noise contribution. In other words, the averaging technique is not applied until the noise level is reduced to a minimum. Instead, the averaging technique is applied only long enough such that the noise level of the digital input signal is reduced to the noise level of the DUT noise contribution that was determined before. This way, the appropriate noise level of the noise-reduced output signal can be obtained without further intermediate steps.

In some embodiments, the preliminary noise-reduced signal may be subtracted from the digital input signal, thereby obtaining a total noise signal. Accordingly, the total noise signal corresponds to the digital input signal, but with the wanted signal removed. It is noted that the wanted signal may also be called "useful signal".

In some embodiments, the total noise signal is weighted with a weighting factor or a weighting function, thereby obtaining a weighted noise signal. Thus, the total noise signal can be modified in a certain manner by the weighting factor or by the weighting function, as is described in more detail hereinafter.

An aspect of the present disclosure provides that the weighting factor or the weighting function depends, for example, on the DUT noise contribution. For example, the weighting factor or the weighting function may be chosen such that the weighted noise signal corresponds to the DUT noise contribution.

According to a further aspect of the present disclosure, the weighted noise signal is added, for example, to the preliminary noise-reduced signal in order to obtain the noise-reduced output signal. As described above, the weighting factor or the weighting function may be chosen such that the weighted noise signal corresponds to the DUT noise contribution. Thus, the noise-reduced output signal has a noise level corresponding to the noise level of the DUT noise contribution. In other words, noise from all sources except the device under test is removed in the noise-reduced output signal.

In some embodiments, the determined DUT noise contribution corresponds to a white Gaussian noise (WGN) distribution. In other words, the DUT noise contribution may be modelled as additive white Gaussian noise. Thus, the DUT noise contribution has a time domain average of zero.

Put differently, the noise level of the DUT noise contribution may be determined by any suitable technique, as described above. Based on the determined noise level, a model representation of the DUT noise contribution, namely the white Gaussian noise distribution, may be determined.

In some embodiments, the white Gaussian noise distribution may be added to the preliminary noise-reduced signal in order to obtain the noise-reduced output signal, analogously to the embodiments described above.

In an embodiment of the present disclosure, an error vector magnitude (EVM) is determined based on the determined DUT noise contribution and/or based on the noise-reduced output signal. Thus, the measurement application may be configured to determine the EVM based on the DUT noise contribution and/or based on the noise-reduced output signal.

As described above, the noise level of the noise-reduced output signal corresponds to the noise level of the DUT noise contribution. Thus, by determining the EVM of the noise-reduced output signal, the EVM of the device under test can be determined with high precision, as the influence of noise originating from electronic components other than the device under test is not present in the determined EVM.

Alternatively or additionally, the EVM is corrected for the DUT noise contribution, such that the EVM takes the DUT noise contribution into account. For example, the EVM associated with the digital input signal may be determined and may be corrected based on the actual DUT noise contribution determined, such that the influence of noise originating from electronic components other than the device under test is eliminated from the determined EVM.

Embodiments of the present disclosure further provide a signal processing system. In an embodiment, the signal processing system comprises a signal input and an analysis circuit. The signal input is configured to receive a digital input signal. The analysis circuit is configured to process and to analyze the digital input signal. The signal processing system is configured to perform any of the methods described above.

Regarding the advantages and further properties of the signal processing system, reference is made to the explanations given above with respect to the signal processing method, which also hold for the signal processing system and vice versa.

In an embodiment of the present disclosure, the signal processing system is integrated into a measurement instrument. Thus, a highly integrated signal processing system is provided.

According to an aspect of the present disclosure, the measurement instrument is established, for example, as an oscilloscope, for example as a digital oscilloscope, as a signal analyzer, as a vector signal analyzer, as a spectrum analyzer, or as a vector network analyzer. However, it is to be understood that the measurement instrument may be established as any other suitable measurement instrument.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 schematically shows a signal processing system according to an embodiment of the present disclosure;

FIG. 2 schematically shows a signal processing system according to another embodiment of the present disclosure.

DETAILED DESCRIPTION

Figure 3:
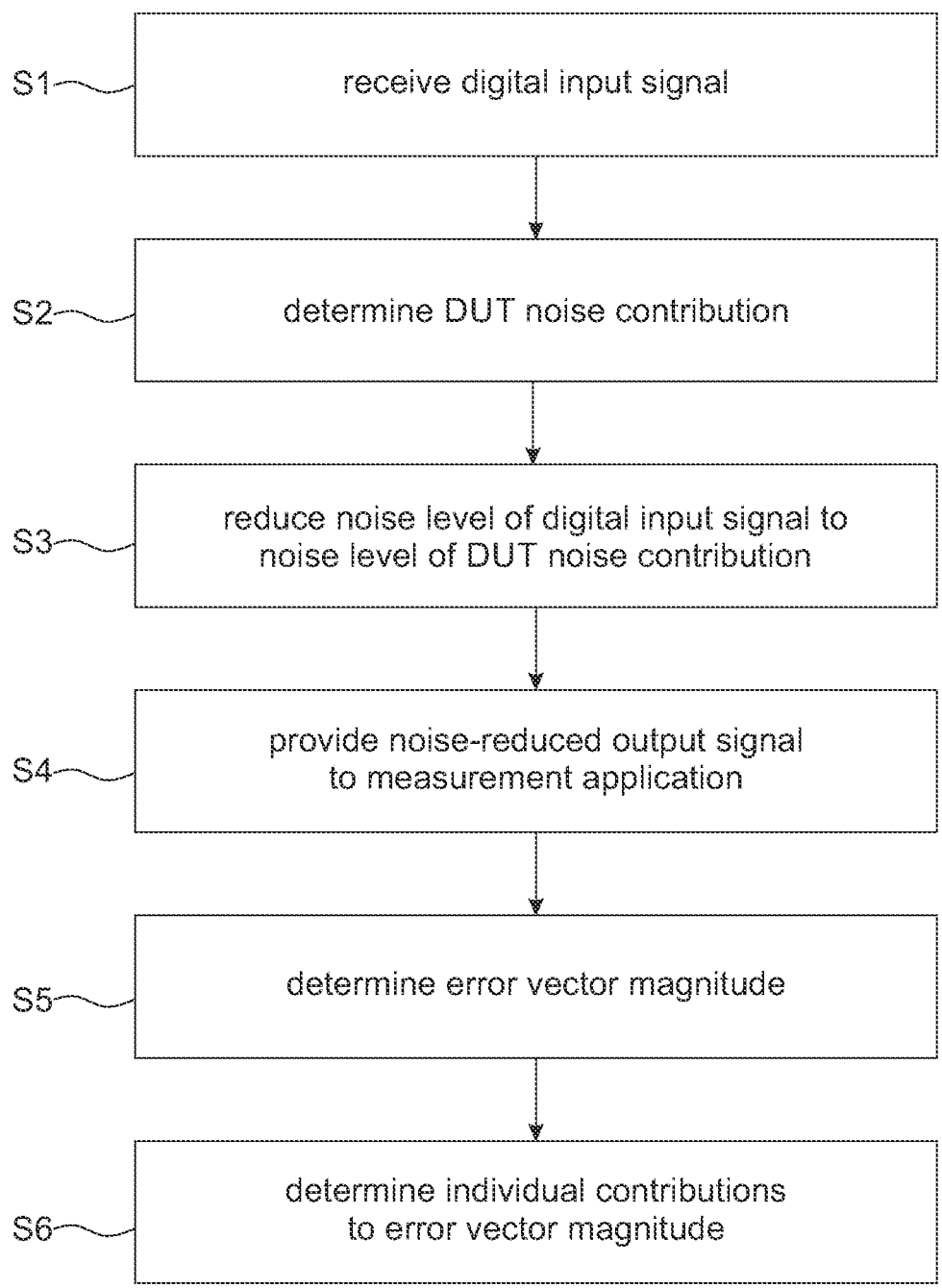
FIG. 3 shows an example of a flow chart of a signal processing method according to an embodiment of the present disclosure.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

FIG. 1 schematically shows a signal processing system 10 comprising a device under test 12 and a measurement instrument 14. The device under test 12 may be established as any electronic device that is configured to generate an electronic signal. In some embodiments, the device under test 12 may be an electronic component that is used in Wi-Fi applications or in 5G applications.

In the particular example shown in FIG. 1, the device under test 12 is established as a two-port device having an input port 16 and an output port 18. For example, the device under test 12 may be established as an amplifier that is configured to amplify an input signal received via the input port 16, and to output a corresponding amplified signal via the output port 18. As another example, the device under test 12 may be established as a filter that is configured to filter an input signal received via the input port 16 in a predefined manner, and to output a corresponding filtered signal via the output port 18.

However, the device under test 12 may also be established as a one-port device having only a single port, or as a multi-port device having more than two ports, e.g. three, four or more ports. Without restriction of generality, the device under test 12 is assumed to be a two-port device as illustrated in FIGS. 1 and 2 in the following.

The measurement instrument 14 is established as any type of suitable measurement instrument that is configured to perform the functionalities described below. For example, the measurement instrument 14 is established as an oscilloscope, for example as a digital oscilloscope, as a signal analyzer, as a vector signal analyzer, as a spectrum analyzer, or as a vector network analyzer.

In the example embodiment illustrated in FIG. 1, the measurement instrument 14 comprises a signal input 20, an analysis circuit 22, a vector signal generator 24, and a signal output 26. The vector signal generator 24 includes circuitry configured to generate a test signal that is forwarded to the input port 16 of the device under test 12 via the signal output 26 of the measurement instrument 14.

In general, the test signal is a digital signal having defined arbitrary properties. The exact properties of the test signal depend on the device under test 12 and on the type of measurements that are to be conducted on the device under test 12. The device under test 12 processes the test signal and generates a digital input signal based on the test signal.

The signal input 20 is connected, for example directly connected with the output port 18 of the device under test 12 in a signal transmitting manner. Therein and in the following, the term "connected in a signal transmitting manner" is understood to denote a cable-based or wireless connection that is configured to transmit signals between the respective devices or components.

The signal input 20 is configured to receive the digital input signal output by the device under test 12. It is noted that further electronic components may be interconnected between the device under test 12 and the signal input 20. However, without restriction of generality it is assumed in the following that the device under test 12 is directly connected with the signal input 20. The digital input signal received via the signal input 20 of the measurement instrument 14 is forwarded to the analysis circuit 22 for further processing, as will be described in more detail below.

FIG. 2 shows another embodiment of the signal processing system 10, wherein only the differences compared to the first embodiment described above with regard to FIG. 1 are explained in the following.

In contrast to the embodiment shown in FIG. 1, the vector signal generator 24 shown in FIG. 2 is not integrated into the measurement instrument 14, but is rather established separately from the measurement instrument 14. The measurement instrument 14 may comprise a further signal input 28 that is connected to the vector signal generator 24 in a signal transmitting manner.

The test signal generated by the vector signal generator 24 may be forwarded to the analysis circuit 22 via the further signal input 28. It is noted that a plurality of further measurement setups are possible with the signal processing system 10 described above.

While the setups illustrated in FIGS. 1 and 2 are associated with measurements of forward transmission parameters of the device under test 12, the setups can readily be adapted for backward transmission measurements, input reflection measurements and/or output reflection measurements.

Irrespective of the particular embodiment, the signal processing system 10 is configured to perform a signal processing method, an example of which is described below and illustrated in FIG. 3.

The digital input signal generated by the device under test 12 is received by the signal input 20 and is forwarded to the analysis circuit 22 (step S1).

As already mentioned above, the digital input signal may be received directly from the output port 18 of the device under test 12. Alternatively, the digital input signal may be received from another electronic component in the signal chain that is interconnected between the device under test 12 and the signal input 20.

In general, the digital input signal may be established as any type of digital signal. Without restriction of generality, a particular exemplary case is described in the following, wherein the digital input signal is an IQ signal comprising IQ data. Thus, the digital input signal comprises in-phase data (I data) and quadrature data (Q data), such that the digital input signal comprises amplitude information and phase information.

A DUT noise contribution to noise of the digital input signal is determined, wherein the DUT noise contribution is associated with noise originating from the device under test 12 (step S2).

The DUT noise contribution may be determined by any suitable technique, for example by any suitable technique known from the state of the art. For example, the techniques described in granted U.S. Pat. No. 10,761,134 B2 may be used in order to determine the DUT noise contribution.

The DUT noise contribution may be determined only once in a first set of measurements before the further steps of the signal processing described below are performed. The results of this first set of measurements, i.e., the DUT noise contribution, can then be used for any other measurement conducted by the signal processing method described below.

A noise level of the digital input signal is reduced to a noise level of the DUT noise contribution determined, thereby obtaining a noise-reduced output signal (step S3).

In other words, noise originating from all sources except for the device under test 12 is selectively removed from the digital input signal, such that the noise level of the noise-reduced output signal corresponds to the noise level of the DUT noise contribution. This can be achieved according to a plurality of different embodiments that are described in the following.

According to a first embodiment, an IQ averaging technique is applied to the digital input signal until the noise level of the input signal matches the noise level of the DUT noise contribution. IQ averaging techniques are per se well known in the prior art, and are thus not explained in more detail herein.

Usually, these averaging techniques are applied until the noise level is reduced to a minimum. However, this cancels all noise regardless of the source of the noise.

Due to the knowledge of the DUT noise level determined in step S2, the IQ averaging technique is applied only long enough such that the noise level of the digital input signal is reduced to the noise level of the DUT noise contribution. This way, the appropriate noise level of the noise-reduced output signal can be obtained without further intermediate steps.

According to a second embodiment, the IQ averaging technique is applied to the digital input signal until the noise level is reduced to a minimum, thereby obtaining a preliminary noise-reduced signal. The determined DUT noise contribution may then be added to the preliminary noise-reduced signal, thereby obtaining the noise-reduced output signal.

In other words, according to the second embodiment, noise is (substantially) completely removed from the digital input signal by the IQ averaging technique. Afterwards, the determined DUT noise contribution is re-added to the preliminary noise-reduced signal, such that the noise level of the noise-reduced output signal corresponds to the noise level of the DUT noise contribution.

In some embodiments, the determined DUT noise contribution may correspond to a white Gaussian noise distribution. In other words, the DUT noise contribution may be modelled as additive white Gaussian noise. The white Gaussian noise distribution is added to the preliminary noise-reduced signal in order to obtain the noise-reduced output signal.

According to a third embodiment, a preliminary noise-reduced signal is obtained as described above. The preliminary noise-reduced signal is subtracted from the digital input signal, thereby obtaining a total noise signal.

Accordingly, the total noise signal corresponds to the digital input signal, but with the wanted signal (also called "useful signal") removed. In some embodiment, the total noise signal is weighted with a weighting factor or a weighting function, thereby obtaining a weighted noise signal.

In some embodiments, the weighting factor or weighting function is determined based on the determined DUT noise contribution. More precisely, the weighting factor or weighting function is chosen such that the weighted noise signal corresponds to the DUT noise contribution.

The weighted noise signal is added to the preliminary noise-reduced signal, thereby obtaining the noise-reduced output signal. In other words, according to the third embodiment, noise is (substantially) completely removed from the digital input signal by the IQ averaging technique. Afterwards, the determined weighted noise signal is re-added to the preliminary noise-reduced signal, such that the noise level of the noise-reduced output signal corresponds to the noise level of the DUT noise contribution.

Summarizing, the noise-reduced output signal obtained by any of the variants described above has a noise level that corresponds to the noise level of the DUT noise contribution.

The noise-reduced output signal is provided to a measurement application for further processing (step S4).

In some embodiments, the measurement application is integrated into the analysis circuit 22.

Alternatively, the noise-reduced output signal may be provided to another circuit of the measurement instrument 14, or to another signal processing device, such as another measurement instrument or a computing device with suitable measurement software.

An error vector magnitude (EVM) is determined based on the noise-reduced output signal and/or based on the determined DUT noise contribution by the measurement application (step S5).

As described above, the noise level of the noise-reduced output signal corresponds to the noise level of the DUT noise contribution.

Thus, by determining the EVM of the noise-reduced output signal based on the noise-reduced output signal, the EVM of the device under test 12 can be determined with high precision, as the influence of noise originating from electronic components other than the device under test is not present in the determined EVM.

Optionally, an additional check may be performed on the determined error vector magnitude by determining the individual contributions to the error vector magnitude (step S6).

The DUT noise contribution causes a certain portion of the overall EVM. However, there are further contributions to the overall EVM, for example non-linearities, frequency response effects, memory effects, frequency offset, I/Q imbalance, I/Q offset, phase drift, amplitude droop, or any combination thereof.

The different contributions to the EVM may be determined by any suitable technique, for example by the techniques described in US Patent Publication US 2021/0018561A1, the disclosure of which is incorporated herein by reference in its entirety.

In some embodiments, the magnitude of the EVM caused by the DUT noise contribution may be compared with the magnitude of the other contributions to the EVM. If the magnitude of the EVM caused by the DUT noise contribution is much larger than the magnitude of the other contributions, this may be a sign that either the device under test 12 is malfunctioning or that the DUT noise contribution should be re-evaluated.

Alternatively or additionally to determining the EVM based on the noise-reduced output signal, the total EVM of the digital input signal may be determined and may be corrected for the DUT noise contribution based on the actual DUT noise contribution determined.

In other words, the total noise contribution to the EVM may be determined, e.g., by the techniques described in US Patent Publication US 2021/0018561A1.

In some embodiment, the total noise contribution to the EVM may be corrected based on the DUT noise contribution determined, namely by a factor that corresponds to the ratio of the DUT noise contribution to overall noise. The corrected EVM contribution may then be recombined with the other contributions to the EVM, such that the recombined EVM has been corrected for the noise originating from electronic components other than the device under test 12.

Summarizing, the EVM associated with the device under test 12 can be determined by the signal processing method described above, wherein the influence of noise generated by any other electronic component other than the device under test 12 on the EVM is eliminated.

Certain embodiments disclosed herein include components, such as the device under test 12, the measurement instrument 14, the analysis circuit 22, the vector signal generator 24, etc., that utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

In some embodiments, the device under test 12, the measurement instrument 14, the analysis circuit 22, and/or the vector signal generator 24, etc., is configured to perform one or more of the steps schematically shown, for example, in FIG. 3. In some of these embodiments, one or more of these components includes one or more computer-readable media containing computer readable instructions embodied thereon that, when executed by one or more computer circuits, cause the one or more computer circuits to perform one or more steps of the method of FIG. 3. In some embodiments, the one or more computer circuits includes a microprocessor, a microcontroller, a central processing unit, a graphics processing unit (GPU), a digital signal processor (DSP), an ASIC, etc.

In some embodiments, the one or more computer-readable media contains computer readable instructions embodied thereon that, when executed by the one or more computer circuits, sometimes referred to as computing devices, cause the one or more computer circuits to perform one or more steps of any of the claimed subject matter.

As used herein, a computer-readable medium is any medium that stores instructions, codes, data, or other information non-transitorily and is directly or indirectly accessible to a computing device, such as a processor, etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A signal processing method for selectively removing noise from a digital input signal, wherein the method comprises:
    receiving, by a signal input, a digital input signal from a device under test (DUT), wherein the digital input signal is generated by the device under test and includes noise originating from the device under test;
    determining, by an analysis circuit, a DUT noise contribution to noise of the digital input signal, wherein the DUT noise contribution is associated with the noise originating from the device under test and is characterized by a DUT noise level;
    reducing, by the analysis circuit, a noise level of the digital input signal to the DUT noise level, thereby obtaining a noise-reduced output signal; and
    providing the noise-reduced output signal to a measurement application for further processing;
    wherein said reducing the noise level of the digital input signal to the DUT noise level comprises at least one of:
        applying an averaging technique to the digital input signal until the noise level of the digital input signal matches the DUT noise level; or
        applying an averaging technique to the digital input signal, thereby obtaining a preliminary noise-reduced signal, and adding the DUT noise level to the preliminary noise-reduced signal, thereby obtaining the noise-reduced output signal.

2. The signal processing method according to claim 1, wherein the averaging technique is an IQ averaging technique.

3. The signal processing method according to claim 1, wherein the DUT noise contribution corresponds to a white Gaussian noise distribution.

4. The signal processing method according to claim 1, wherein an error vector magnitude (EVM) is determined based on the DUT noise contribution and/or based on the noise-reduced output signal.

5. The signal processing method according to claim 4, wherein the EVM is corrected for the DUT noise contribution, such that the EVM takes the DUT noise contribution into account.

6. A signal processing system, comprising:
    a signal input configured to receive a digital input signal from a device under test (DUT) the digital input signal including noise originating from the device under test; and
    an analysis circuit configured to process and analyze the digital input signal, wherein the analysis circuit is configured to:
        determine a DUT noise contribution to noise of the digital input signal, wherein the DUT noise contribution is associated with the noise originating from a device under test;
        reduce a noise level of the digital input signal to a noise level of the DUT noise contribution, thereby obtaining a noise-reduced output signal; and
        provide the noise-reduced output signal to a measurement application for further processing;
    wherein the analysis circuit is configured to reduce the noise level of the digital input signal to the noise level of the DUT noise contribution by at least one of:
        applying an averaging technique to the digital input signal until the noise level of the digital input signal matches the noise level of the DUT noise contribution; or
        applying the averaging technique to the digital input signal, thereby obtaining a preliminary noise-reduced signal, and adding the DUT noise contribution to the preliminary noise-reduced signal, thereby obtaining the noise-reduced output signal.

7. The signal processing system of claim 6, wherein the signal processing system is integrated into a measurement instrument.

8. The signal processing system of claim 7, wherein the measurement instrument is established as an oscilloscope, as a signal analyzer, as a vector signal analyzer, as a spectrum analyzer, or as a vector network analyzer.

9. The signal processing system of claim 7, wherein the measurement instrument is established as a digital oscilloscope.

10. A signal processing system, comprising:
    a signal input configured to receive a digital input signal from a device under test (DUT); and
    an analysis circuit configured to process and analyze the digital input signal, wherein the analysis circuit is configured to:
        determine a DUT noise contribution to noise of the digital input signal, wherein the DUT noise contribution is associated with noise originating from a device under test;
        reduce a noise level of the digital input signal to a noise level of the DUT noise contribution determined, thereby obtaining a noise-reduced output signal; and provide the noise-reduced output signal to a measurement application for further processing;

wherein the analysis circuit is configured to reduce the noise level of the digital input signal to the noise level of the DUT noise contribution by applying the averaging technique to the digital input signal, thereby obtaining a preliminary noise-reduced signal, by subtracting the preliminary noise-reduced signal from the digital input signal, thereby obtaining a total noise signal, by weighting the total noise signal with a weighting factor or a weighting function, thereby obtaining a weighted noise signal, and by adding the weighted noise signal to the preliminary noise-reduced signal, thereby obtaining the noise-reduced output signal, wherein the weighting factor or the weighting function depends on the DUT noise contribution, such that the weighted noise signal corresponds to the DUT noise contribution.

* * * * *

UNITED STATES PATENT AND TRADEMARK OFFICE
CERTIFICATE OF CORRECTION

PATENT NO. : 12,345,742 B2  
APPLICATION NO. : 18/177280  
DATED : July 1, 2025  
INVENTOR(S) : Florian Ramian Page 1 of 1

It is certified that error appears in the above-identified patent and that said Letters Patent is hereby corrected as shown below:

In the Claims

| Column(s) | Line(s) | |
|---|---|---|
| 12 | 18 | Claim 6, delete "(DUT)" and insert -- (DUT), -- |

Signed and Sealed this  
Sixteenth Day of September, 2025

Coke Morgan Stewart  
*Acting Director of the United States Patent and Trademark Office*